United States Patent
Bactasa

(10) Patent No.: US 9,530,675 B2
(45) Date of Patent: Dec. 27, 2016

(54) WAFER HANDLING STATION INCLUDING CASSETTE MEMBERS WITH LATERAL WAFER CONFINING BRACKETS AND ASSOCIATED METHODS

(71) Applicant: STMicroelectronics Pte Ltd., Singapore (SG)

(72) Inventor: Romolo Recorba Bactasa, Serangoon (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 705 days.

(21) Appl. No.: 13/622,556

(22) Filed: Sep. 19, 2012

(65) Prior Publication Data

US 2014/0077667 A1 Mar. 20, 2014

(51) Int. Cl.
*H01L 21/673* (2006.01)
*H05K 13/00* (2006.01)

(52) U.S. Cl.
CPC ... *H01L 21/67309* (2013.01); *H01L 21/67303* (2013.01); *H05K 13/0084* (2013.01); *Y10T 29/49826* (2015.01)

(58) Field of Classification Search
CPC .............. H01L 21/67303; H01L 21/67309; H01L 21/67313; H01L 21/6732; H01L 21/67326; H01L 21/67346; H01L 21/67369; H01L 21/67769; H01L 21/67386; H01L 21/67383; H01L 21/67333; H01L 21/67742; H01L 21/68707; A47B 81/068; G11B 23/0236; G11B 23/04; H05K 13/0084
USPC ......................................... 206/710, 711, 712
See application file for complete search history.

(56) References Cited

U.S. PATENT DOCUMENTS

| | | | |
|---|---|---|---|
| 5,137,063 A | 8/1992 | Foster et al. | |
| 5,310,339 A * | 5/1994 | Ushikawa | 432/253 |
| 5,458,688 A * | 10/1995 | Watanabe | C30B 31/14 118/724 |
| 5,749,469 A * | 5/1998 | Williams | H01L 21/67383 206/454 |
| 5,897,311 A * | 4/1999 | Nishi | C23C 16/4583 432/239 |
| 5,905,302 A | 5/1999 | Lane et al. | |
| 6,093,644 A * | 7/2000 | Inaba | H01L 21/67306 206/710 |
| 6,287,112 B1 * | 9/2001 | Van Voorst Vader | H01L 21/67309 118/728 |
| 6,341,935 B1 * | 1/2002 | Tseng | H01L 21/67303 118/500 |
| 6,454,508 B2 | 9/2002 | Toshima et al. | |

(Continued)

FOREIGN PATENT DOCUMENTS

WO   WO 2009048068 A1 *   4/2009

*Primary Examiner* — Glenn Myers
(74) *Attorney, Agent, or Firm* — Allen, Dyer, Doppelt, Milbrath & Gilchrist, P.A.

(57) ABSTRACT

A wafer handling station includes a housing defining a chamber, and a wafer cassette assembly positionable in the chamber. The wafer cassette assembly includes a vertical support, and cassette members carried by the vertical support in spaced relation. Each cassette member includes a base coupled to the vertical support, wafer contact pads on an upper surface of the base and configured to support a wafer thereon, and a pair of wafer brackets carried by the base and configured to engage respective edges of the wafer to laterally confine the wafer.

22 Claims, 5 Drawing Sheets

(56) References Cited

U.S. PATENT DOCUMENTS

| | | | |
|---|---|---|---|
| 6,532,642 B1* | 3/2003 | Wingo | H01L 21/67309 |
| | | | 118/500 |
| 6,599,076 B2 | 7/2003 | Toshima et al. | |
| 6,776,846 B2 | 8/2004 | Maher et al. | |
| 7,204,887 B2* | 4/2007 | Kawamura et al. | 118/725 |
| 7,641,247 B2* | 1/2010 | Blonigan | H01L 21/68707 |
| | | | 294/213 |
| 7,922,485 B2* | 4/2011 | Nitadori | F27B 17/0025 |
| | | | 414/940 |
| 8,800,774 B2* | 8/2014 | Bonora | H01L 21/67383 |
| | | | 206/710 |
| 2002/0187023 A1* | 12/2002 | Araki | C30B 31/14 |
| | | | 414/160 |
| 2005/0188923 A1* | 9/2005 | Cook et al. | 118/728 |
| 2006/0249080 A1* | 11/2006 | Zehavi et al. | 118/725 |
| 2009/0053021 A1* | 2/2009 | Yamagishi | H01L 21/67259 |
| | | | 414/222.02 |
| 2010/0236587 A1* | 9/2010 | Hamada et al. | 134/133 |

* cited by examiner

WAFER HANDLING STATION INCLUDING CASSETTE MEMBERS WITH LATERAL WAFER CONFINING BRACKETS AND ASSOCIATED METHODS

FIELD OF THE INVENTION

The present invention relates to the field of semiconductor processing equipment, and more particularly, to a wafer cassette assembly for holding semiconductor wafers to be processed, and related methods.

BACKGROUND OF THE INVENTION

Typically, semiconductor processing equipment has a number of chambers in which semiconductor processing occurs. Arm assemblies or other robotic devices are generally used to move semiconductor wafers from a wafer handling station to various chambers for processing. When the processing is finished, the wafer is returned to the wafer handling station.

Semiconductor processing is typically done in a vacuum. The wafer handling station includes a chamber and a wafer cassette assembly positionable in the chamber. The wafer cassette assembly includes spaced apart cassette members stacked one on top of another, where each cassette member holds a respective wafer.

For example, the wafer handling station disclosed in U.S. Pat. No. 6,454,508 is a dual cassette loadlock. A workpiece loading interface includes two separate chambers, where each chamber may be separately pumped down. While a first cassette of wafers, from a first chamber is being accessed, a second cassette of wafers may be loaded in the second chamber and the second chamber pumped down. Each cassette of wafers includes spaced apart cassette members stacked one on top of another, where each cassette member holds a respective wafer. Each chamber has a door associated therewith. After the door is opened, a cassette of wafers is lowered through the opening in a motion much like a drawbridge. The cassette of wafers may then be pivoted within the chamber.

Another wafer handling station is disclosed in U.S. Pat. No. 5,905,302. The wafer handling station includes one or more wafer cassette members defining two or more coplanar wafer seats, a movable stem supporting the cassette members, and an actuating member connected to the stem to move the cassette members.

To minimize or reduce contact between a surface of a wafer and a cassette member, contact pads may be used. The contact pads are spaced apart on a surface of each cassette member. However, the wafers have a tendency to walk out from the cassette members due to vibration during operation of the semiconductor processing equipment. As a result, the edges of the wafers may become damaged, or the surface of the wafers may be scratched, or the wafers may even be broken. Damaged wafers reduce productivity and efficiency of the semiconductor processing equipment.

SUMMARY OF THE INVENTION

In view of the foregoing background, it is therefore an object of the present invention to protect the edges of semiconductor wafers held by cassette members in a wafer handling station.

This and other objects, features, and advantages in accordance with the present invention are provided by a wafer handling station comprising a housing defining a chamber, and a wafer cassette assembly positionable in the chamber. The wafer cassette assembly may comprise a vertical support, and a plurality of cassette members carried by the vertical support in spaced relation and configured to hold respective wafers.

Each cassette member may comprise a base coupled to the vertical support, a plurality of wafer contact pads on an upper surface of the base and configured to support a wafer thereon, and a pair of wafer brackets carried by the base and configured to engage respective edges of the wafer to laterally confine the wafer.

Laterally confining a wafer on a cassette member may advantageously prevent the wafer from walking out from the cassette member due to vibration of the wafer handling station. Productivity and efficiency of semiconductor processing equipment are increased when edges of the wafers are protected.

In one embodiment, the base may have a proximal end coupled to the vertical support and have a pair of distal ends spaced from the proximal end. The plurality of wafer contact pads may comprise a proximal contact pad adjacent the proximal end of the base and a pair of distal wafer contact pads adjacent the respective distal ends of the base. The pair of wafer brackets may be adjacent the respective distal ends of the base. In this embodiment, each wafer bracket may be coupled to a respective distal wafer contact pad. Also, each wafer bracket and respective distal wafer contact pad may be integrally formed as a monolithic unit. In another embodiment, the base has a circular shape.

Each wafer bracket may have an L-shape. The pair of wafer brackets may be positioned on the base so that the wafer is laterally confined at respective locations past a halfway position of the wafer, for example.

The base may have a proximal end coupled to the vertical support, and the vertical support may comprise a plurality of stacked proximal wafer brackets, with each proximal wafer bracket adjacent the proximal end of a respective base and defining a backstop for the wafer.

Another aspect is directed to a method for making a wafer cassette member for the wafer handling station as described above.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime notations are used to indicate similar elements in alternative embodiments.

Figure 1:
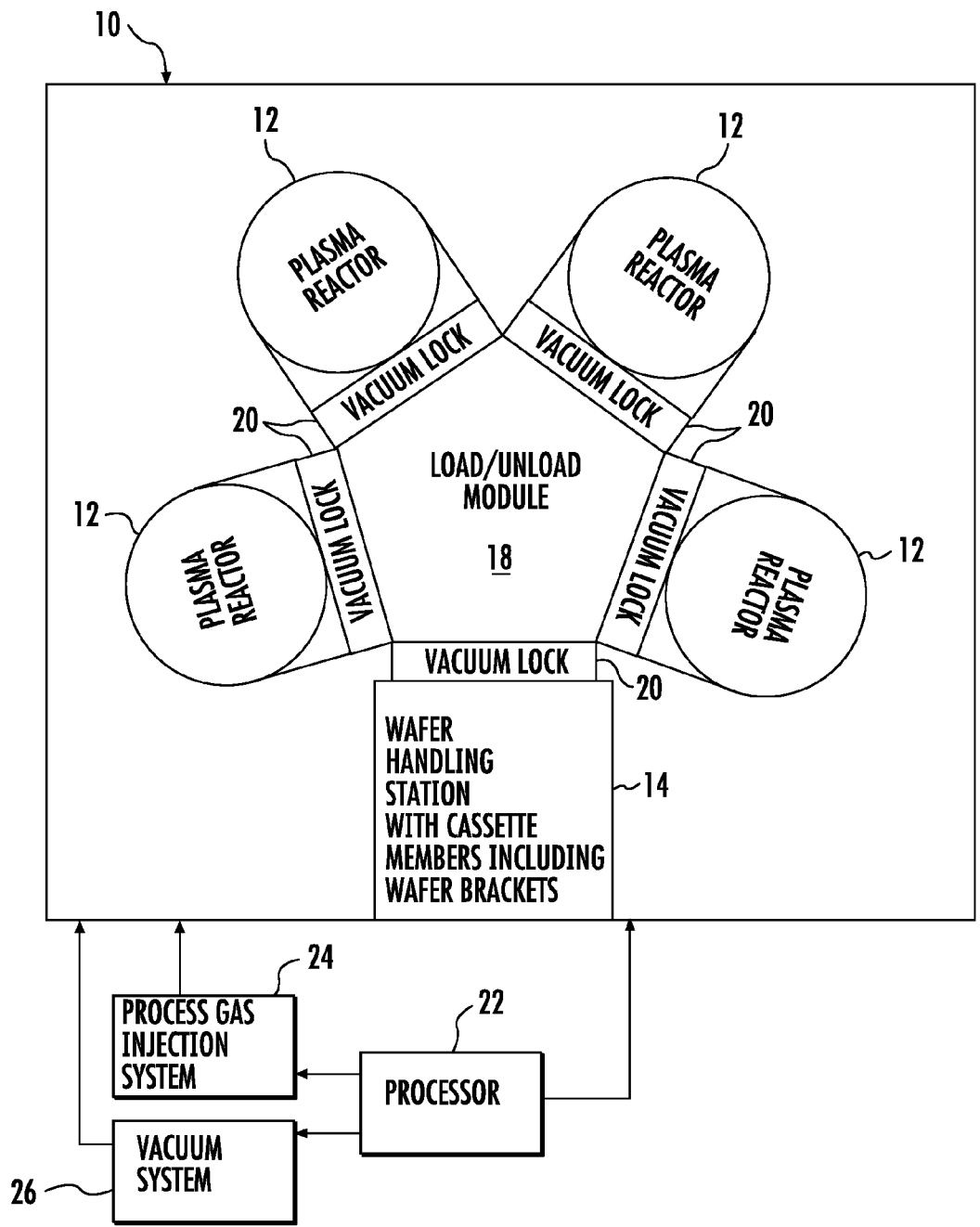
FIG. 1 is a block diagram of a semiconductor processing system with a wafer handling station in accordance with the present invention.

Referring initially to FIG. 1, a contamination-free semiconductor processing system 10 includes a plurality of single-wafer plasma reactors 12 and a wafer handling station 14. As will be described in greater detail below, the wafer handling station 14 includes wafer brackets to engage respective edges of the wafers to laterally confine the wafers so as to prevent them from walking out from their holders due to vibration.

A load/unload module 18 is disposed concentrically within the plasma reactors 12 and the wafer handling station 14 for transferring wafers to be processed and after processing between the wafer handling station 14 and one or more of the plasma reactors 12. A plurality of vacuum locks 20 are individually provided at the interfaces of the plasma reactors 12 and the load/unload module 18, and between the interface of the wafer handling station 14 and the load/unload module 18. A processor 22 is operatively coupled to the plasma reactors 12, to the wafer handling station 14, and to the load/unload module 18 for activating and de-energizing radio frequency plasma inducing fields, for controlling and processing the signal output of end-point determination detectors coupled to the plasma reactors, and for initiating and coordinating wafer transfer between the several reactors and the wafer handling station.

A reactant gas injection system 24 is operatively coupled to the plasma reactors 12 for controllably injecting preselected reactants and other process gases into the plasma reactors. A vacuum system 26 is operatively coupled to the plasma reactors 12, to the wafer handling station 14, and to the load/unload module 18 for maintaining the entire assembly at a controlled vacuum condition during operation. The processor 22 is operatively coupled to the reactant gas injection system 24 and to the vacuum system 26.

Figure 2:
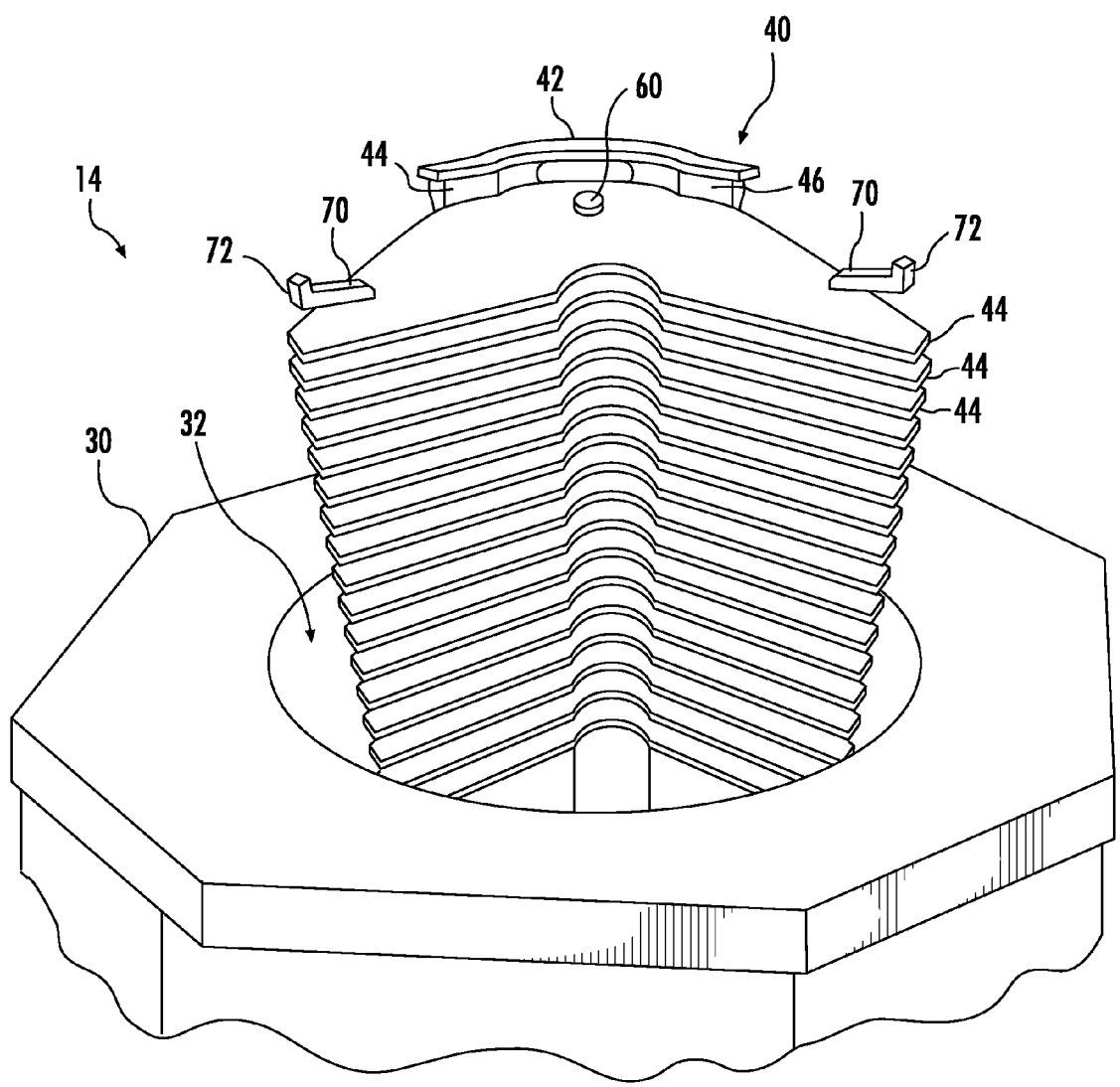
FIG. 2 is a perspective view of a portion of the wafer handling station illustrated in FIG. 1.
Figure 3:
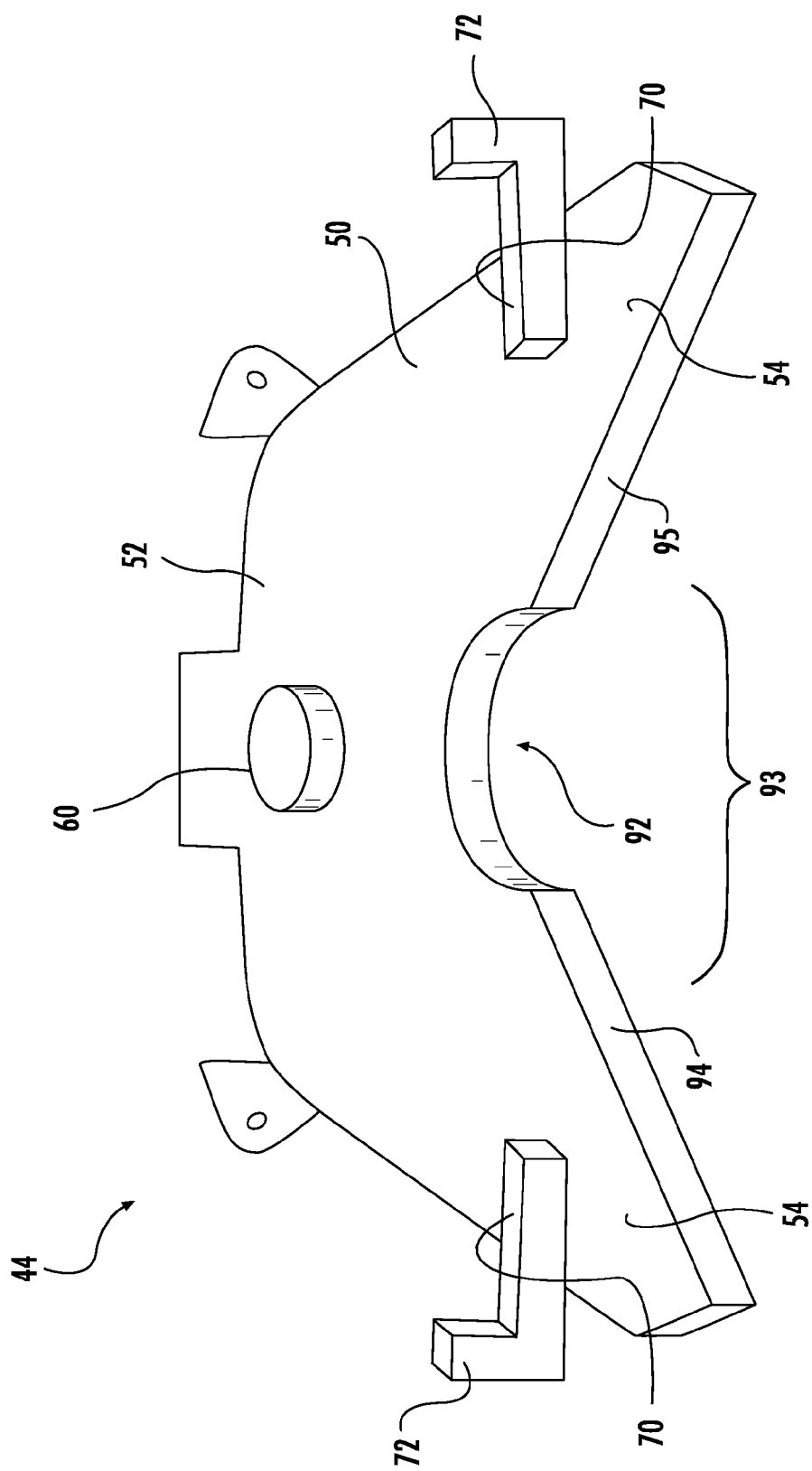
FIG. 3 is a perspective view of one of the empty cassette members illustrated in FIG. 2.
Figure 4:
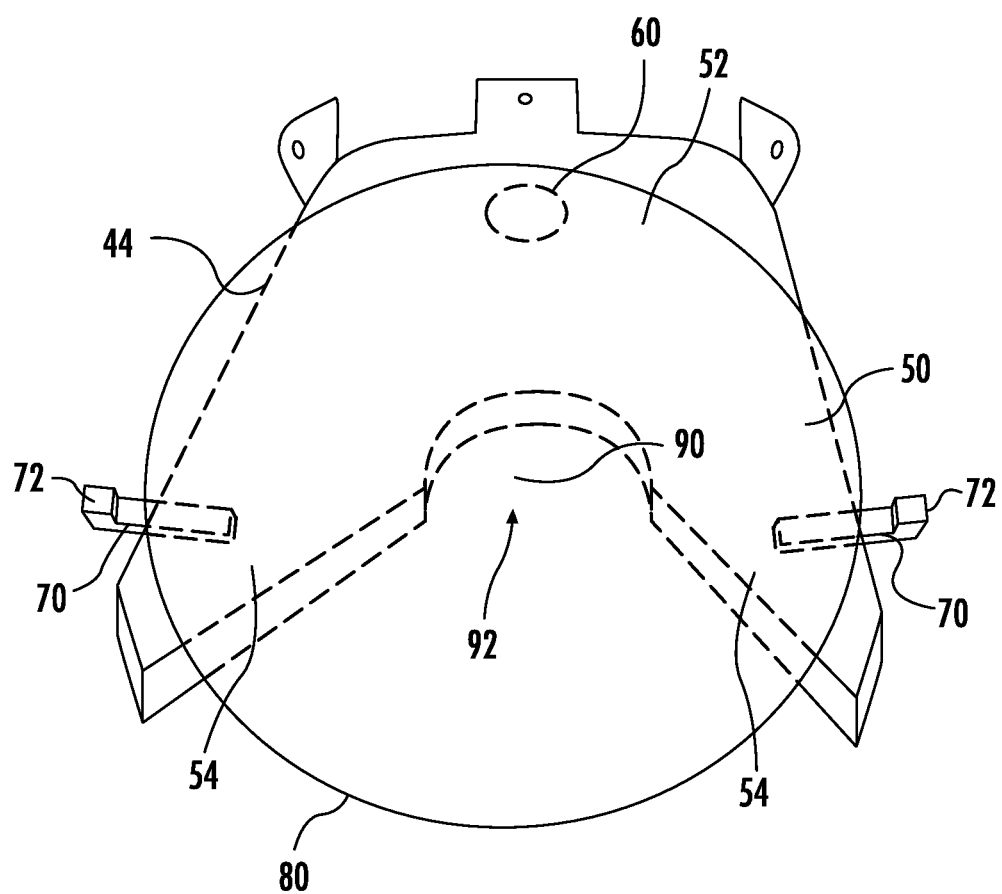
FIG. 4 is a top view of a cassette member shown in FIG. 3 holding a semiconductor wafer.

Referring now to FIGS. 2-4, the wafer handling station 14 will be discussed in greater detail. The wafer handling station 14 includes a housing 30 defining a chamber 32, and a wafer cassette assembly 40 positionable in the chamber. The wafer cassette assembly 40 includes a vertical support 42, and a plurality of cassette members 44 carried by the vertical support in spaced relation. In the illustrated embodiment, there are 17 cassette members 44. Each cassette member 44 is configured to hold a respective semiconductor wafer.

In the illustrated embodiment, each cassette member 44 includes a base 50 coupled to the vertical support 42, a plurality of wafer contact pads 60, 70 is on an upper surface of the base and configured to support a wafer thereon, and a pair of wafer brackets 72 is carried by the base and configured to engage respective edges of the wafer to laterally confine the wafer.

More particularly, each base 50 may have a proximal end 52 coupled to the vertical support 42 and have a pair of distal ends 54 spaced from the proximal end. The plurality of wafer contact pads includes a proximal wafer contact pad 60 adjacent the proximal end 52 of the base 50, and a pair of distal wafer contact pads 70 adjacent the respective distal ends 54 of the base 50. The pair of wafer brackets 72 is adjacent the respective distal ends 54 of the base 50.

As illustrated, each wafer bracket 72 is coupled to a respective distal wafer contact pad 70. When coupled together, each wafer bracket 72 and respective distal wafer contact pad 70 may be integrally formed as a monolithic unit. Each monolithic unit may have an L-shape, for example. Alternatively, each wafer bracket 72 and respective distal wafer contact pad 70 may be spaced apart from one another.

The illustrated wafer proximal contact pad 60 is disk-shaped, and has a diameter of about 10 mm, and a height of about 1.5 mm. The spacing between the stacked cassette members 44 is about 8 mm. The distal wafer contact pad 70 has a height corresponding to a height of the proximal wafer contact pad 60, which in the illustrated example is also about 1.5 mm. The height of the distal wafer bracket 72 may be within a range of about 2.5-5 mm. This allows about 1-2.5 mm of the distal wafer bracket 72 to be exposed for laterally confining the wafer 80.

The overall combined length of the distal wafer contact pad 70 and the distal wafer bracket 72 depends on the diameter of the wafer 80. For example, the diameter of the wafer 80 may be about 150 mm, wherein the diameter of the chamber 32 in the housing 30 of the wafer handling station 14 is about 160 mm. In the illustrated example, the overall combined length is within a range of about 20-30 mm, with about 5 mm extending out from an edge of the wafer 80, as perhaps best illustrated in FIG. 4.

As shown in FIG. 4, the wafer 80 is supported by both the proximal wafer contact pad 60 and the distal wafer contact pads 70 on the cassette member 44. The distal wafer brackets 72 laterally confine the edges of the wafer 80. Laterally confining the wafer 80 with the cassette member 44 advantageously prevents the wafer from walking out due to vibration of the wafer handling station 14. Productivity and efficiency of semiconductor processing equipment are increased when edges of the wafers are protected from damage.

The pair of distal wafer contact pads 70 and the pair of distal wafer brackets 72 are positioned on the base 50 so that a wafer 80 is laterally confined at respective locations past a center or halfway position 90 of the wafer. The base 50 illustratively has a central recess 92 therein aligned with the wafer and a V-shaped notch 93 in communication with the central recess. The V-shaped notch 93 is defined by sides 94, 95 extending outwards from the central recess 92. Other shapes for the base 50 are also useable, as will be appreciated by those skilled in the art.

To protect the edges of a wafer 80 with respect to the vertical support 42, the vertical support 42 may include a plurality of stacked proximal wafer brackets 46, each adjacent the proximal end 52 of a respective base 50 and defining a backstop for the wafer 80.

Figure 5:
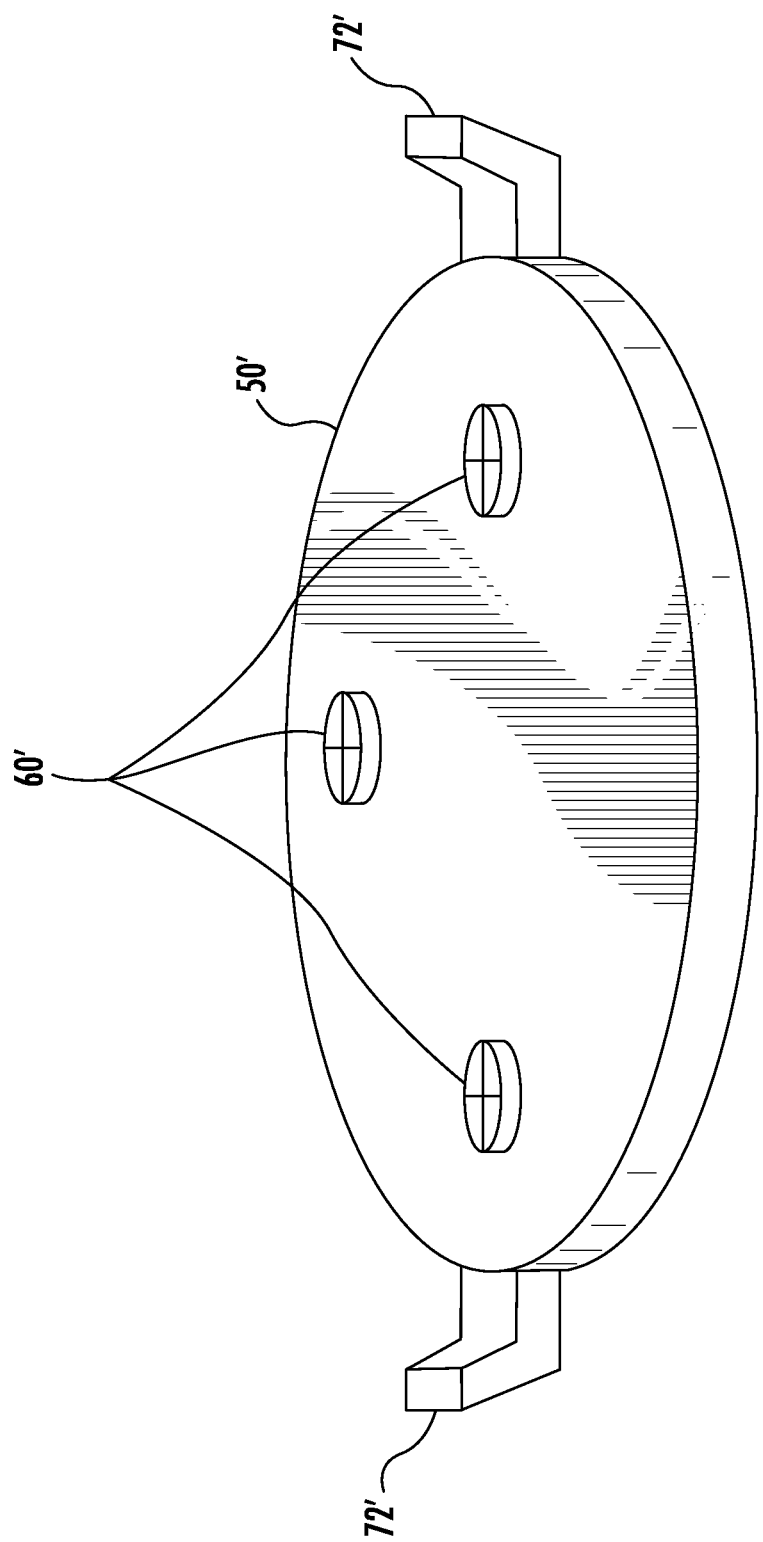
FIG. 5 is a perspective view of another embodiment of a cassette member in accordance with the present invention.

In another embodiment, the base 50' has a circular shape, as illustrated in FIG. 5. In particular, a plurality of wafer contact pads 60' is on an upper surface of the base and configured to support a wafer thereon, and a pair of wafer brackets 72' is carried by the base 50' to engage respective edges of the wafer to laterally confine the wafer. In the illustrated embodiment, the wafer brackets 72' are attached to sides of the base 50'. Alternatively, the wafer brackets 72' may be attached to a bottom surface of the base 50', or to the upper surface of the base 50'.

The height of the wafer bracket 72' is configured so that about 1-2.5 mm of the wafer bracket is to be exposed for laterally confining the wafer 80. The reach of the wafer bracket 72' beyond the base 50' is configured so that there is about a 5 mm gap between an edge of the wafer 80. The actual dimensions will vary based on the intended wafer handling station 14.

Another aspect is directed to a method for making a cassette member 44 to be coupled to a vertical support 42 for a wafer handling station 14. The method comprises forming a base 50 to be coupled to the vertical support 42, coupling a plurality of wafer contact pads 60, 70 on an upper surface of the base 50 and configured to support a wafer thereon, and coupling a pair of wafer brackets 72 to the base 50 and configured to engage respective edges of the wafer 80 to laterally confine the wafer. Productivity and efficiency of semiconductor processing equipment are increased when edges of the wafers are protected from damage.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A wafer handling station comprising:
a housing defining a chamber; and
a wafer cassette assembly positionable in the chamber and comprising
a vertical support, and
a plurality of cassette members carried by said vertical support in spaced relation and configured to hold a plurality of semiconductor wafers, each cassette member comprising
a substantially planar base coupled to said vertical support, said base having a proximal end coupled to said vertical support and having a pair of distal ends spaced from the proximal end and not coupled to said vertical support,
a plurality of wafer contact pads on an upper surface of said base and configured to support a respective semiconductor wafer thereon, and
a pair of wafer brackets carried by said base and outwardly extending beyond outer edges of said base and configured to engage respective edges of the respective semiconductor wafer to laterally confine the respective semiconductor wafer.

2. The wafer handling station according to claim 1 wherein said plurality of wafer contact pads comprises a proximal wafer contact pad adjacent the proximal end of said base and a pair of distal wafer contact pads adjacent the respective distal ends of said base; and wherein said pair of wafer brackets are adjacent the respective distal ends of said base.

3. The wafer handling station according to claim 2 wherein each wafer bracket is coupled to a respective distal wafer contact pad.

4. The wafer handling station according to claim 3 wherein each wafer bracket and respective distal wafer contact pad are integrally formed as a monolithic unit.

5. The wafer handling station according to claim 1 wherein said base has a central recess therein aligned with the respective semiconductor wafer and a V-shaped notch in communication with the central recess.

6. The wafer handling station according to claim 1 wherein each wafer bracket has an L-shape.

7. The wafer handling station according to claim 1 wherein said pair of wafer brackets is positioned on said base so that the respective wafer is laterally confined at respective locations past a halfway position of the respective wafer.

8. The wafer handling station according to claim 1 wherein said base has a proximal end coupled to said vertical support; and wherein said vertical support comprises a plurality of stacked proximal wafer brackets, with each proximal wafer bracket adjacent the proximal end of a respective base and defining a backstop for the respective semiconductor wafer.

9. A wafer cassette assembly for a wafer handling station comprising:
a vertical support; and
a plurality of cassette members carried by said vertical support in spaced relation and configured to hold a plurality of semiconductor wafers, each cassette member comprising
a substantially planar base coupled to said vertical support, said base having a proximal end coupled to said vertical support and having a pair of distal ends spaced from the proximal end and not coupled to said vertical support,
a plurality of wafer contact pads on an upper surface of said base and configured to support a respective semiconductor wafer thereon, and
a pair of wafer brackets carried by said base and outwardly extending beyond outer edges of said base and configured to engage respective edges of the respective semiconductor wafer to laterally confine the respective semiconductor wafer.

10. The wafer cassette assembly according to claim 9 wherein said plurality of wafer contact pads comprises a proximal wafer contact pad adjacent the proximal end of said base and a pair of distal wafer contact pads adjacent the respective distal ends of said base; and wherein said pair of wafer brackets are adjacent the respective distal ends of said base.

11. The wafer cassette assembly according to claim 10 wherein each wafer bracket is coupled to a respective distal wafer contact pad.

12. The wafer cassette assembly according to claim 11 wherein each wafer bracket and respective distal wafer contact pad are integrally formed as a monolithic unit.

13. The wafer cassette assembly according to claim 9 wherein said base has a central recess therein aligned with the respective semiconductor wafer and a V-shaped notch in communication with the central recess.

14. The wafer cassette assembly according to claim 9 wherein each wafer bracket has an L-shape.

15. The wafer cassette assembly according to claim 9 wherein said pair of wafer brackets is positioned on said base so that the respective semiconductor wafer is laterally confined at respective locations past a halfway position of the respective semiconductor wafer.

16. The wafer cassette assembly according to claim 9 wherein said base has a proximal end coupled to said vertical support; and wherein said vertical support comprises a plurality of stacked proximal wafer brackets, with each proximal wafer bracket adjacent the proximal end of a respective base and defining a backstop for the respective semiconductor wafer.

17. A method for making a cassette member to be coupled to a vertical support for a wafer handling station, comprising
forming a substantially planar base to be coupled to the vertical support, the base having a proximal end to be coupled to the vertical support and having a pair of distal ends spaced from the proximal end and not coupled to the vertical support;
coupling a plurality of wafer contact pads on an upper surface of the base and configured to support a respective wafer thereon; and
coupling a pair of wafer brackets to the base and outwardly extending beyond outer edges of the base and configured to engage respective edges of the respective wafer to laterally confine the respective wafer.

18. The method according to claim 17 wherein the plurality of wafer contact pads comprises a proximal wafer contact pad adjacent the proximal end of the base and a pair of distal wafer contact pads adjacent the respective distal ends of the base; and wherein the pair of wafer brackets are adjacent the respective distal ends of the base.

19. The method according to claim 18 wherein each wafer bracket is coupled to a respective distal wafer contact pad.

20. The method according to claim 19 wherein each wafer bracket and respective distal wafer contact pad are integrally formed as a monolithic unit.

21. The method according to claim 18 wherein each wafer bracket has an L-shape.

22. The method according to claim 18 wherein the pair of wafer brackets is positioned on the base so that the respective wafer is laterally confined at respective locations past a halfway position of the respective wafer.

\* \* \* \* \*